United States Patent
Chen et al.

(10) Patent No.: US 10,739,921 B2
(45) Date of Patent: Aug. 11, 2020

(54) TRANSPARENT CONDUCTIVE FILM, TOUCH SCREEN AND MANUFACTURING METHOD THEREOF

(71) Applicant: NANCHAGN O-FILM DISPLAY TECHNOLOGY CO., LTD, Nanchang (CN)

(72) Inventors: Hongyan Chen, Nanchang (CN); Rongzhi Gu, Nanchang (CN); Weiting Huang, Nanchang (CN); Xiaowei Hou, Nanchang (CN)

(73) Assignee: NANCHANG O-FILM DISPLAY TECHNOLOGY CO., LTD, Nanchang (CN)

( * ) Notice: Subject to any disclaimer, the term of this patent is extended or adjusted under 35 U.S.C. 154(b) by 0 days.

(21) Appl. No.: 16/046,998

(22) Filed: Jul. 27, 2018

(65) Prior Publication Data
US 2019/0095003 A1    Mar. 28, 2019

(30) Foreign Application Priority Data

Sep. 22, 2017 (CN) .......................... 2017 1 0864221
Sep. 22, 2017 (CN) ...................... 2017 2 1227506 U

(51) Int. Cl.
| | |
|---|---|
| *G06F 3/044* | (2006.01) |
| *B32B 27/32* | (2006.01) |
| *B32B 15/085* | (2006.01) |
| *B32B 7/02* | (2019.01) |
| *H05K 1/02* | (2006.01) |
| *G06F 3/041* | (2006.01) |
| *H05K 3/06* | (2006.01) |
| *H05K 1/09* | (2006.01) |

(52) U.S. Cl.
CPC ................ *G06F 3/044* (2013.01); *B32B 7/02* (2013.01); *B32B 15/085* (2013.01);
(Continued)

(58) Field of Classification Search
CPC ...... G06F 3/044; G06F 3/0445; G06F 3/0412; G06F 2203/04103; H05K 1/0274;
(Continued)

(56) References Cited

U.S. PATENT DOCUMENTS 7,390,099 B2 *   6/2008   Takao ...................... G02B 1/10
                                                                      359/601
7,963,660 B2 *   6/2011   Hamamoto ....... G02F 1/133502
                                                                      359/601
(Continued)

*Primary Examiner* — Jose R Soto Lopez
(74) *Attorney, Agent, or Firm* — Franklin & Associates International Inc; Matthew Lambrinos

(57) ABSTRACT

A transparent conductive film includes a substrate having opposed first and second surfaces; a first optical adjustment layer formed on the first surface; a first transparent conductive layer formed on the first optical adjustment layer; a first metal layer formed on the first transparent conductive layer; a second optical adjustment layer formed on the second surface; a second transparent conductive layer formed on the second optical adjustment layer; and a second metal layer formed on the second transparent conductive layer. At least one of the first optical adjustment layer and the second optical adjustment layer comprises a plurality of particles therein, such that a plurality of protrusions corresponding to the plurality of particles are formed on a surface of at least one of the first metal layer and the second metal layer.

16 Claims, 4 Drawing Sheets

(52) U.S. Cl.
CPC .......... *B32B 27/325* (2013.01); *G06F 3/0412* (2013.01); *G06F 3/0445* (2019.05); *H05K 1/0274* (2013.01); *B32B 2457/208* (2013.01); *G06F 2203/04103* (2013.01); *H05K 1/09* (2013.01); *H05K 3/06* (2013.01); *H05K 2201/0108* (2013.01)

(58) Field of Classification Search
CPC .... H05K 2201/0108; H05K 1/09; H05K 3/06; B32B 27/325; B32B 15/085; B32B 7/02; B32B 2457/208
See application file for complete search history.

(56) References Cited

U.S. PATENT DOCUMENTS

| | | | | |
|---|---|---|---|---|
| 8,124,215 | B2* | 2/2012 | Takao | G02B 1/105 428/143 |
| 8,313,201 | B2* | 11/2012 | Wakizaka | G02B 1/111 359/599 |
| 9,607,733 | B2* | 3/2017 | Takada | G06F 3/0412 |
| 9,609,745 | B2* | 3/2017 | Takada | H05K 1/0298 |
| 2006/0072197 | A1* | 4/2006 | Iwata | G02B 5/128 359/529 |
| 2007/0291367 | A1* | 12/2007 | Hamamoto | G02B 1/111 359/601 |
| 2011/0102385 | A1* | 5/2011 | Jung | G02F 1/13452 345/204 |
| 2012/0073947 | A1* | 3/2012 | Sakata | G06F 3/044 200/600 |
| 2012/0237729 | A1* | 9/2012 | Ozawa | C08J 7/0427 428/147 |
| 2013/0133933 | A1* | 5/2013 | Tsuno | H05K 1/0313 174/255 |
| 2017/0010709 | A1* | 1/2017 | Hashimoto | B32B 7/02 |
| 2019/0009963 | A1* | 1/2019 | Wessely | B32B 3/30 |
| 2019/0039355 | A1* | 2/2019 | Oh | B32B 27/08 |
| 2019/0113791 | A1* | 4/2019 | Yamamoto | G06F 3/0412 |

\* cited by examiner

TRANSPARENT CONDUCTIVE FILM, TOUCH SCREEN AND MANUFACTURING METHOD THEREOF

CROSS REFERENCE TO RELATED APPLICATION

This application claims priority under 35 U.S.C. § 119 to Chinese Patent Applications No. 2017108642217 and No. 2017212275061 filed Sep. 22, 2017, the entire content of which is incorporated herein in its entirety.

TECHNICAL FIELD

The present disclosure relates to touch screens, and more particularly relates to a transparent conductive film, a touch screen, and a manufacturing method thereof.

BACKGROUND

Transparent conductive film is a core component of a capacitive touch screen. With the rapid development of intelligent terminals, the demand for the transparent conductive film is also increased. The transparent conductive film generally includes a substrate, and hard coating layers, conductive layers, and metal layers, which are disposed at both sides of the substrate. Recently, since a non-crystalline polymer film has a smaller birefringence and is uniform in optical performance compared with the crystalline polymer film, most of the transparent conductive films are manufactured by the substrate formed by the non-crystalline polymer films.

The non-crystalline polymer film is much more fragile than the crystalline polymer film, such that the surface of the non-crystalline polymer film is more susceptible to damages. When the transparent conductive film is rolled up to make a roll, there is a problem that adjacent metal layers of the transparent conductive film are blocked to each other by pressure. To address this problem, particles are added into the hard coating layer to form protrusions on a surface of the metal layer. The protrusions allow adjacent metal layers to form point contact, thereby avoiding pressure bonding and blocking.

However, when the particles are added into the hard coating layer, the light will be refracted, scattered, and blocked when going through the hard coating layer, resulting in a decrease of the overall light transmittance of the conductive film, thereby further deteriorating the optical performance of the conductive film.

SUMMARY

According to various embodiments of the present disclosure, a transparent conductive film, a touch screen, and a manufacturing method thereof are provided.

A transparent conductive film includes a substrate having opposed first and second surfaces; a first optical adjustment layer formed on the first surface; a first transparent conductive layer formed on the first optical adjustment layer; a first metal layer formed on the first transparent conductive layer; a second optical adjustment layer formed on the second surface; a second transparent conductive layer formed on the second optical adjustment layer; and a second metal layer formed on the second transparent conductive layer. At least one of the first optical adjustment layer and the second optical adjustment layer comprises a plurality of particles therein, such that a plurality of protrusions corresponding to the plurality of particles are formed on a surface of at least one of the first metal layer and the second metal layer.

A touch screen includes a substrate having opposed first and second surfaces, the substrate includes a touch region in a middle portion thereof and a lead region on a periphery of the touch region; a first electrode formed on the first optical adjustment layer and within the touch region; a first lead formed on the first optical adjustment layer and within the lead region; a second optical adjustment layer formed on the second surface; a second electrode formed on the second optical adjustment layer and within the touch region; and a second lead formed on the second optical adjustment layer and within the lead region. At least one of the first optical adjustment layer and the second optical adjustment layer comprises a plurality of particles therein, such that a plurality of protrusions corresponding to the plurality of particles are formed on a surface of at least one of the first electrode and the second electrode.

A method of manufacturing a touch screen includes the following steps:

providing a transparent conductive film; wherein the transparent conductive film includes a substrate having opposed first and second surfaces; a first optical adjustment layer formed on the first surface; a first transparent conductive layer formed on the first optical adjustment layer; a first metal layer formed on the first transparent conductive layer; a second optical adjustment layer formed on the second surface; a second transparent conductive layer formed on the second optical adjustment layer; and a second metal layer formed on the second transparent conductive layer; wherein at least one of the first optical adjustment layer and the second optical adjustment layer comprises a plurality of particles therein, such that a plurality of protrusions corresponding to the plurality of particles are formed on a surface of at least one of the first metal layer and the second metal layer;

etching the first metal layer and the second metal layer to expose the first transparent conductive layer and the second transparent conductive layer located in a touch region, and forming a metal lead pattern located in a lead region; and etching the first transparent conductive layer and the second transparent conductive layer to form a first electrode and a second electrode located in the touch region, and forming a transparent lead pattern located in the lead region; wherein the metal lead pattern and the transparent lead pattern cooperatively form an electrode lead.

The above and other features of the invention including various novel details of construction and combinations of parts, and other advantages, will now be more particularly described with reference to the accompanying drawings and pointed out in the claims.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE EMBODIMENTS

Embodiments of the invention are described more fully hereinafter with reference to the accompanying drawings, in which preferred embodiments of the invention are shown. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present. The terms "vertical", "horizontal", "left" and "right" and other similar expressions used herein is for the purpose of describing particular embodiments only and is not intended to be limiting of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items.

Figure 1:
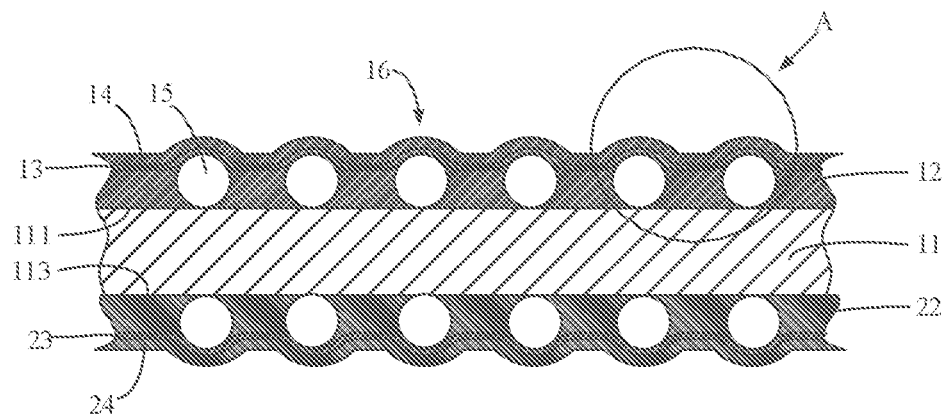
FIG. 1 is a schematic view of a transparent conductive film according to an inventive embodiment.
Figure 2:
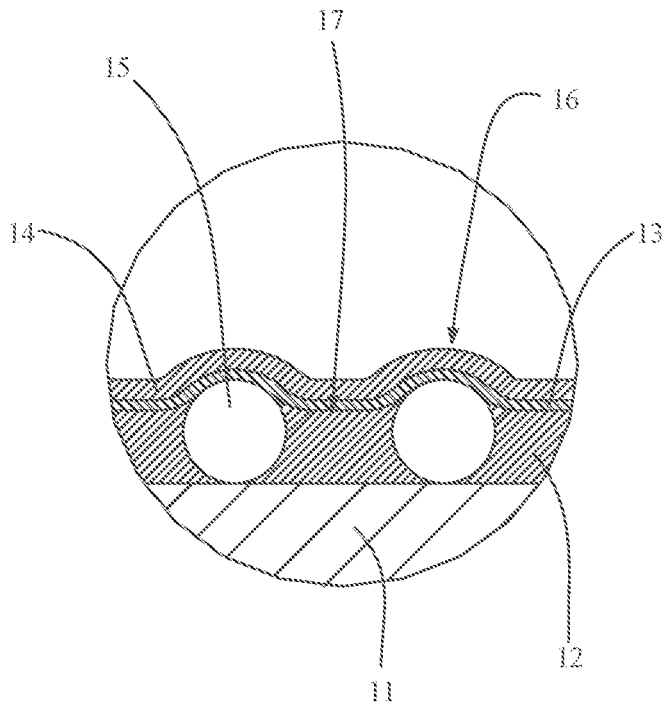
FIG. 2 is an enlarged view of a portion A of FIG. 1.

Referring to FIG. 1 and FIG. 2, a transparent conductive film 10 according to an embodiment includes a substrate 11, a first optical adjustment layer 12, a first transparent conductive layer 13, a first metal layer 14, a second optical adjustment layer 22, a second transparent conductive layer 23, and a second metal layer 24 laminated on each side of the substrate 11, respectively.

The substrate 11 has opposed first surface 111 and second surface 113. The ordinal numbers such as "first" and "second" recited in the present application are merely identifiers, but do not have any other meanings, for example, a particular order and the like. The substrate 11 is made of a non-crystalline polymer film. Since the non-crystalline polymer film has a less birefringence than that of the crystalline polymer film and is more uniform, color irregularity in the transparent conductive film 10 can be eliminated. The non-crystalline polymer film used in the embodiment has an in-plane birefringence of about 0 to about 0.001. In one embodiment, the in-plane birefringence can range from about 0 to about 0.0005. The non-crystalline polymer film used in the embodiment has an in-plane birefringence irregularity of about 0.0005 or lower. In some embodiments, the in-plane birefringence irregularity is about 0.0003 or lower.

The aforementioned birefringence and birefringence irregularity can be achieved by selecting a suitable type of non-crystalline polymer film. The substrate 11 formed by the non-crystalline polymer film typically has a thickness of about 20 µm to about 200 µm.

The first optical adjustment layer 12, the first transparent conductive layer 13, and the first metal layer 14 are sequentially laminated on the first surface 111. The second optical adjustment layer 22, the second transparent conductive layer 23, and the second metal layer 24 are sequentially laminated on the second surface 113.

The first optical adjustment layer 12 serves to improve an optical performance of the transparent conductive film 10. In the subsequent process, after the first transparent conductive layer 13 is patterned, the first optical adjustment layer 12 can minimize the difference of the reflectivity between a portion with the first transparent conductive layer 13 and a portion without the first transparent conductive layer 13, so as to prevent patterns of the first transparent conductive layer 13 from being viewed by people.

In addition, the first optical adjustment layer 12 is also configured to improve the refractive process when the light goes through the different film structures. A refractive index of the first optical adjustment layer 12 is configured to be at a mean value between the refractive index of the substrate 11 and the first transparent conductive layer 13. Therefore, the first optical adjustment layer 12 can play a transitional role in the propagation path of light. The first optical adjustment layer 12 is made of at least one material selected from the group consisting of silicone polymer, acrylate polymer, aromatic ring or naphthalene ring polymer, zirconium oxide, titanium oxide, and antimony oxide.

The first transparent conductive layer 13 is formed on a surface of the first optical adjustment layer 12. The first transparent conductive layer 13 has a high transmittance (about 80% or higher) in a visible light region (380 nm to 780 nm). The first transparent conductive layer 13 is formed by a layer having a surface resistance value per unit area (unit: $\Omega/m^2$) of about 500 $\Omega/m^2$ or lower. The first transparent conductive layer 13 has a thickness of about 10 nm to about 100 nm. In one embodiment, the thickness can range from about 15 nm to about 50 nm. The first transparent conductive layer 13 is typically made of any one of indium tin oxide (ITO), indium zinc-oxide or indium oxide-zinc oxide composite oxide.

The first metal layer 14 is formed on a surface of the first transparent conductive layer 13. The first metal layer 14 is used to form wirings outside a touch input region when using the transparent conductive film 10 of the embodiment for a touch panel. A material for forming the first metal layer 14 is typically copper or silver, and other metals excellent in conductivity can also be used. In one embodiment, the first metal layer 14 has a thickness of about 50 nm to about 500 nm. In another embodiment, the thickness can range from about 100 nm to about 300 nm.

Moreover, the second optical adjustment layer 22, the second transparent conductive layer 23, and the second metal layer 24 have the same film structures, functions, and physical properties as those of the first optical adjustment layer 12, the first transparent conductive layer 13, and the first metal layer 14, respectively, thus they will not described here.

Furthermore, the first optical adjustment layer 12 and/or the second optical adjustment layer 22 include a plurality of particles 15 therein, such that a plurality of protrusions 16 are formed on a surface of the first metal layer 14 and/or the second metal layer 24, respectively.

Specifically, the particles 15 can be distributed in the first optical adjustment layer 12 and/or the second optical adjustment layer 22 randomly or in a preset manner (e.g., evenly). The particle 15 can be substantially a spherical particle or an amorphous particle. The particles 15 can be included in both of the first optical adjustment layer 12 and the second optical adjustment layer 22, thereby obtaining a transparent conductive film 10 forming the protrusions 16 on both surfaces thereof. Alternatively, the particles 15 can be only included in one of the first optical adjustment layer 12 and the second optical adjustment layer 22, thereby obtaining a transparent conductive film 10 forming the protrusions 16 on a single surface thereof.

In the following, the first optical adjustment layer 12 is taken as an example for description.

The particles 15 protrude from the surface of the first optical adjustment layer 12, such that the surface of the first optical adjustment layer 12 forms a convex region, and a region of the first optical adjustment layer 12 where no particle 15 is provided forms a flat region 17. Since the first transparent conductive layer 13 and the first metal layer 14 are sequentially laminated on the surface of the first optical adjustment layer 12, the surface shapes of the first transparent conductive layer 13 and the first metal layer 14 are the same as that of the first optical adjustment layer 12. Thus, a plurality of protrusions 16 forms at a region of the first metal layer 14 corresponding to the particles 14.

Similarly, when the second optical adjustment layer 22 includes the particles 15 therein, the surface of the second metal layer 24 can also form the plurality of protrusions 16.

When an elongated transparent conductive film 10 is manufactured by a roll-to-roll process, the plurality of protrusions 16 are formed on the surfaces of the first metal layer 14 and/or the second metal layer 24 due to the particles 15. Therefore, when the transparent conductive film 10 is rolled, adjacent two metal layers will form point contact therebetween due to the plurality of protrusions 16, thereby avoiding pressure bonding.

In the illustrated embodiment, the first optical adjustment layer 12 and the second optical adjustment layer 22 both include the particles 15 therein, such that the plurality of protrusions 16 are formed on the surfaces of the first metal layer 14 and the second metal layer 24.

In other words, the obtained transparent conductive film 10 forms the plurality of protrusions 16 on both surfaces thereof. Therefore, when the transparent conductive film 10 is rolled, point positions of the point contact between the two adjacent metal layers increases, such that the effect of anti-blocking is better.

Figure 3:
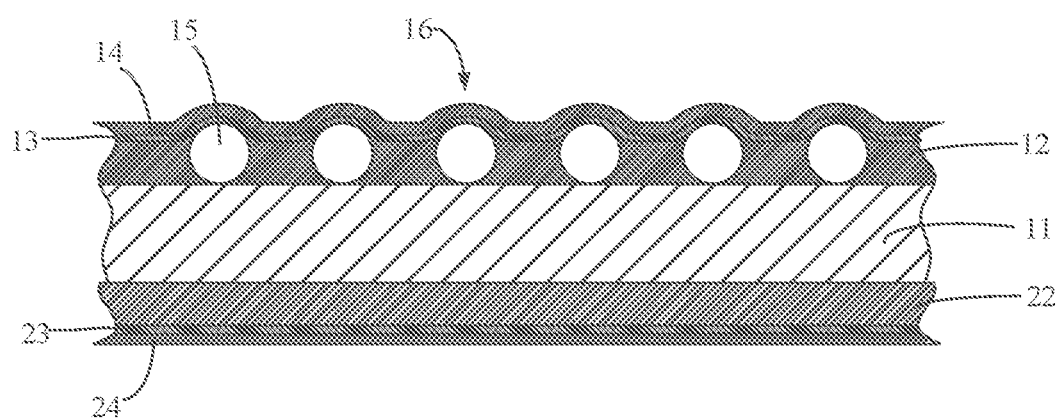
FIG. 3 is a schematic view of a transparent conductive film according to another embodiment.

Referring to FIG. 3, in another embodiment, any one of the first optical adjustment layer 12 and the second optical adjustment layer 22 includes the particles 15, such that the plurality of protrusions 16 are formed on the surface of the first metal layer 14 or the second metal layer 24.

In other words, the obtained transparent conductive film 10 forms the plurality of protrusions 16 on a single surface thereof. Therefore, it is possible to prevent the shadows of the two layers of particles 15 form being superimposed on each other, while avoiding pressure bonding, so as to reduce the haze, thereby further enhancing the optical performance of the transparent conductive film 10.

Compared to the conventional conductive film, the transparent conductive film 10 does not include a hard coating layer, and the particles 15 are located in the optical adjustment layer (at least one of the first optical adjustment layer 12 and the second optical adjustment layer 22). On the one hand, the hard coating layer is omitted such that the film structure can be reduced, thereby reducing the occlusion of light. Moreover, this simplifies the structure, which facilitates simplifying the process and saving cost. On the other hand, the optical adjustment layer itself has the function of adjusting the optical performance, such that when the light goes through the particles 15 located in the optical adjustment layer, the resulted refraction and scattering phenomena are enhanced. Therefore, the overall light transmittance of the aforementioned transparent conductive film 10 is increased, thereby effectively improving the optical performance.

Furthermore, during the manufacturing process of the conventional conductive film, the hard coating layer will release water vapor or organic solvents, thereby resulting in a poor crystallinity of the conductive layer (e.g., ITO layer) and a non-uniform square resistance. The water vapor or organic solvents released by the illustrated transparent conductive film 10 is decreased due to the absent of the hard coating layer, such that the crystallinity of the conductive layer can be improved, and the square resistance thereof is more uniform. Additionally, the brittleness of the transparent conductive film 10 is decreased, and the performance of cutting and rolling process of the conductive film is greatly improved, thereby effectively preventing the occurrence of cracking when punching a large sheet material.

In order to avoid the deterioration of the mechanical strength of the substrate 11 after the hard coating layer is omitted, in the illustrated embodiment, the substrate 11 is a cycloolefin polymer film.

Cycloolefin polymer (COP) is a novel non-crystalline polymer material with a high hardness and an excellent light transmittance, but it has large brittleness. Therefore, both surfaces thereof are often coated with hard coating layers to improve its brittleness, however, such customary method ignores the side effects of the hard coating layer on subsequent crystallization. In the illustrated embodiment, since the particles 15 are added into the optical adjustment layer, the strength and toughness thereof are increased, such that the substrate 11 can be protected. Therefore, even if the hard coating layer is omitted, the substrate 11 can also be made of the COP material, such that the substrate 11 has a high hardness and a good light transmittance.

In the illustrated embodiment, the first optical adjustment layer 12, the second optical adjustment layer 22, and the particle 15 are made of the same material.

Since the first optical adjustment layer 12 and the second optical adjustment layer 22 (hereinafter referred as the optical adjustment layer), and the particle 15 are made of the same material, thus optical parameters thereof are also the same. Therefore, light propagation is less affected at a connection interface between the particle 15 and the optical adjustment layer, and the particle 15 and the optical adjustment layer are nearly to a whole. When the light goes through the first optical adjustment layer 12 and the second optical adjustment layer 22 included the particle 15, the distortion caused by the propagation path thereof is small. Therefore, the transparent conductive film 10 can avoid the adverse effect of the optical performance thereof while achieving the purpose of avoiding pressure bonding.

Specifically, in the illustrated embodiment, the particle 15 is made of a material selected from the group consisting of silica, silicone polymer, acrylic polymer, styrene polymer, and a composition thereof.

The aforementioned materials have the advantages of good light transmission and readily available, and the aforementioned materials used in the particle 15 can save costs while meeting the performance requirements. Of course, other suitable materials may also be selected in accordance with actual performance and cost requirements.

In addition, in the illustrated embodiment, the particle 15 are substantially spherical or ellipsoidal. The spherical or ellipsoidal particle 15 has a smooth outer surface. Thus, an outer surface of the formed protrusions 16 also has a correspondingly smooth surface. When the protrusion 16 forms a point support to prevent pressure bonding, the surface of the protrusion 16 abuts against the metal layer, and the protrusion 16 having the smooth outer surface can prevent the metal layer from damage. Additionally, when the light goes through the particles 15 having the smooth outer surface, the deformation of the optical path caused by refraction and scattering is small, such that the optical performance of the transparent conductive film 10 can be further improved.

In the illustrated embodiment, flat regions 17 of the first optical adjustment layer 12 and the second optical adjustment layer 22 have a thickness of about 45 nm to about 145 nm. As described above, the flat region 17 is a region of the first optical adjustment layer 12 or the second optical adjustment layer 22 where no particle 15 is provided. Within this range, the optical adjustment effect of the optical adjustment layer 12, 22 is optimal, such that the optical performance of the transparent conductive film 10 can be optimized.

In order to achieve a better anti-blocking effect, the intensive degree of the protrusions 16 has corresponding requirements. In the illustrated embodiment, distribution density of the protrusions 16 is about 100 to about 3000 protrusions per square millimeter.

If the distribution density of the protrusions 16 is too large, the haze value of the transparent conductive film 10 will be increased, and the light transmittance will be decreased, which will further seriously affect the appearance and optical performance of the transparent conductive film 10. However, if the distribution density of the protrusions 16 is too small, the anti-blocking effect is limited. Within the aforementioned density range, the transparent conductive film 10 can effectively achieve both anti-blocking and optical performance.

Additionally, The distribution density of the protrusions 16 can be changed by adjusting the shape, size, and content of the particles 15.

Moreover, in the illustrated embodiment, the plurality of protrusions 16 have a height of about 0.1 µm to 0.5 µm along a direction perpendicular to the surface of the first optical adjustment layer 14 and/or the second optical adjustment layer 24.

The height of the protrusion 16 refers to a height of the protrusion 16 protruding from the surface of the first metal layer 14 and/or the second metal layer 24. Due to the smaller size of the particle 15, it is difficult to precisely control the height of each projection 16. Thus, it is sufficient to control the height of the protrusion 16 within the aforementioned height range. It should be noted that, in actual production, since accurate control of each particle 15 is difficult, it is difficult to avoid that the height of the protrusions 16 formed by a few of the particles 15 is outside the above range. However, the influence caused by such protrusion 16 is negligible. Additionally, the aforementioned height can also refer to an arithmetic mean of the heights of a certain number of protrusions 16 within a preset range.

In general, the higher the height of the protrusion 16, the better the anti-blocking effect. However, with the increasing of the height, the size of the particle 15 is correspondingly required to increase. As a result, the haze value of the transparent conductive film 10 also increases, and the optical performance of the transparent conductive film 10 will be seriously affected when the haze value thereof reaching a certain extent. Within the aforementioned height range, the transparent conductive film 10 can effectively achieve both anti-blocking and optical performance.

In the aforementioned transparent conductive film 10, the plurality of protrusions 16 are formed on the surfaces of the first metal layer 14 and/or the second metal layer 24 due to the particles 15. Therefore, when the transparent conductive film 10 is rolled, the plurality of protrusions 16 can cause point contact between adjacent two metal layers, thereby avoiding pressure bonding. Furthermore, compared to the conventional conductive film, the transparent conductive film 10 does not include a hard coating layer, and the particles 15 are located in the optical adjustment layer. On the one hand, the hard coating layer is omitted such that the film structure can be reduced, thereby reducing the occlusion of light. On the other hand, the optical adjustment layer itself has the function of adjusting the optical performance, such that when the light goes through the particles 15 located in the optical adjustment layer, the resulted refraction and scattering phenomena are enhanced. Therefore, the overall light transmittance of the aforementioned transparent conductive film 10 is increased, thereby effectively improving the optical performance.

Figure 4:
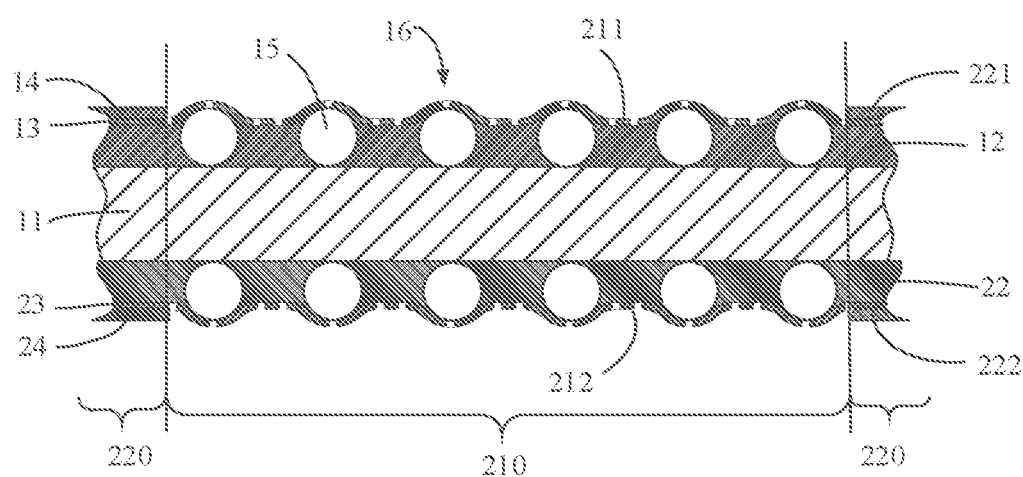
FIG. 4 is a schematic view of a touch screen according to an embodiment.

Furthermore, referring to FIG. 4, a touch screen 200 is further provided in accordance with an embodiment. The touch screen 200 is manufactured by the aforementioned transparent conductive film 10.

In the illustrated embodiment, the touch screen 200 includes a substrate 11, a first optical adjustment layer 12, a first electrode 211, a first lead 221, a second optical adjustment layer 22, a second electrode 212, and a second lead 222.

The substrate 11 of the touch screen 200 can be divided into a touch region 210 and a lead region 220. Specifically, the touch region 210 is located in a middle portion of the substrate 11, and the lead region 220 is disposed around a periphery of the substrate 11.

The first optical adjustment layer 12 and/or the second optical adjustment layer 22 includes a plurality of particles 15 therein, such that a plurality of protrusions 16 corresponding to the plurality of particles 15 are formed on a surface of the first electrode 211 and the second electrode 212. The substrate 11 and the first and second optical adjustment layers 12, 22 have been described above, and will not be described in detail here.

The first electrode 211 is formed on the first optical adjustment layer 12 and is located within the touch region 210. The second electrode 212 is formed on the second optical adjustment layer 22 and is located within the touch region 210. Specifically, the first electrode 211 is etched by the first transparent conductive layer 13, and the second electrode 212 is etched by the second transparent conductive layer 23. The first electrode 211 and the second electrode 212 are etched into electrode patterns. Specifically, the electrode pattern is generally elongated and intersects vertically with each other as a grid pattern. The opposed first electrode 211 and second electrode 212 form two electrodes of a capacitor structure.

The first lead 221 is formed on the first optical adjustment layer 12 and is located within the lead region 220. The second lead 222 is formed on the second optical adjustment layer 22 and is located within the lead region 220. The first lead 221 and the second lead 222 have a double-layered structure, so as to be electrically coupled to the first electrode 211 and the second electrode 212. Specifically, the first lead 221 includes the first transparent conductive layer 13 and a first metal layer 14 formed on the first transparent conductive layer 13. The first transparent conductive layer 13 is provided with a transparent lead pattern, and the first metal layer 14 is provided with a metal lead pattern. The second lead 222 includes the second transparent conductive layer 23 and a second metal layer 24 formed on the second transparent conductive layer 23. The second transparent conductive layer 23 is provided with the transparent lead pattern, and the second metal layer 24 is provided with the metal lead pattern.

Specifically, the first lead 221 is formed by etching the first metal layer 14 and the first transparent conductive layer 13 located in the lead region 220. The second lead 222 is formed by etching the second metal layer 24 and the second transparent conductive layer 23 located in the lead region 220.

In the aforementioned touch screen 200, the first lead 221 and the second lead 222 are directly etched by the first metal layer 14, the second metal layer 24, the first transparent conductive layer 13, and the second transparent conductive layer 23. Therefore, it is no longer necessary to form the leads electrically coupled to the first electrode and the second electrode by screen printing. Compared with the conventional touch screen, due to without screen printing, a width of the electrode lead directly formed by a photolithography process can be further reduced, such that the touch screen has a narrow frame.

Figure 5:
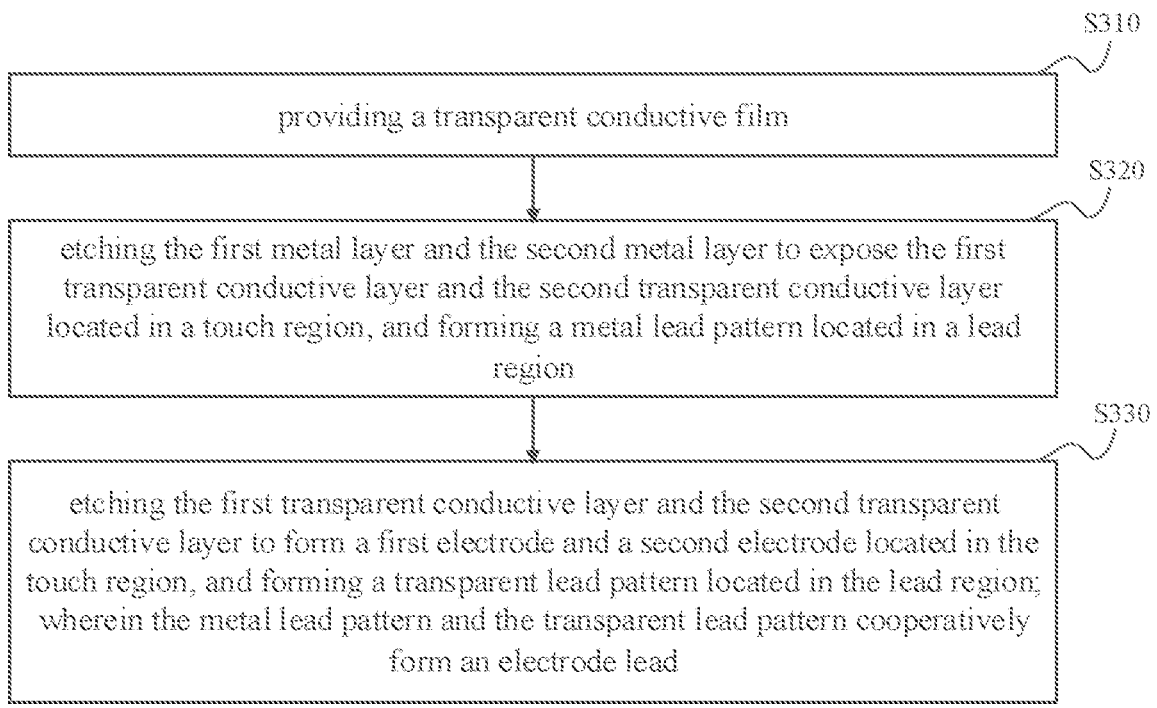
FIG. 5 is a flow chart of a method of manufacturing a touch screen according to an embodiment.

Referring to FIG. 5, a method of manufacturing a touch screen is further provided in accordance with an embodiment, which includes the following steps of:

In step S310, a transparent conductive film is provided.

Specifically, the aforementioned transparent conductive film 10 shown in FIG. 1 is provided. The transparent conductive film 10 includes the first transparent conductive layer 13 and the first metal layer 14, which are sequentially laminated, and the second transparent conductive layer 23 and the second metal layer 24, which are sequentially laminated.

In step S320, the first metal layer 14 and the second metal layer 24 are etched to expose the first transparent conductive layer 13 and the second transparent conductive layer 23 of a touch region. A metal lead pattern located in a lead region is formed.

Specifically, the metal lead pattern can be formed on a surface of the metal layer by a photolithography process. The metal lead pattern is disposed along the edge of the touch screen. After the metal layer is etched, portions of the first transparent conductive layer 13 and the second transparent conductive layer 24 under the metal layer are exposed.

In step S330, the first transparent conductive layer 13 and the second transparent conductive layer 23 are etched to form a first electrode 211 and a second electrode 212 located in the touch region. And a transparent lead pattern located in the lead region is formed. The metal lead pattern and the transparent lead pattern cooperatively form an electrode lead.

Specifically, the exposed portions of the first transparent conductive layer 13 and the second transparent conductive layer 23 are etched by another photolithography process to form an electrode pattern, thereby obtaining the first electrode 211 and the second electrode 212. Meanwhile, the first metal layer 14 and the second metal layer 24 provided with the metal lead pattern are overlapped with the first transparent conductive layer 13 and the second transparent conductive layer 23 in the lead region, respectively, thereby forming the first lead 221 and the second lead 222 in a double-layered structure. The first lead 221 and the second lead 222 are electrically coupled to the first electrode 211 and the second electrode 212, respectively.

When the touch screen 200 is manufactured using the aforementioned method, the first metal layer 14, the second metal layer 24, the first transparent conductive layer 13, and the second transparent conductive layer 23 are directly etched, such that the first electrode 211, the second electrode 212, the first lead 221 electrically coupled to the first electrode 211, and the second lead 222 electrically coupled to the second electrode 212 are obtained. Therefore, it is no longer necessary to form a lead by screen printing, thereby effectively simplifying the process and improving the processing efficiency. Moreover, the touch screen manufactured by the aforementioned method has a narrow frame.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A transparent conductive film, comprising:
   a substrate having opposed first and second surfaces;
   a first optical adjustment layer formed on the first surface;
   a first transparent conductive layer formed on the first optical adjustment layer;
   a first metal layer formed on the first transparent conductive layer;
   a second optical adjustment layer formed on the second surface;
   a second transparent conductive layer formed on the second optical adjustment layer; and
   a second metal layer formed on the second transparent conductive layer;
   wherein at least one of the first optical adjustment layer and the second optical adjustment layer comprises a plurality of particles therein, such that a plurality of protrusions corresponding to the plurality of particles are formed on a surface of at least one of the first metal layer and the second metal layer;
   wherein the first optical adjustment layer being configured to have a refractive index of a mean value between a refractive index of the substrate and the first transparent conductive layer; and
   wherein the second optical adjustment layer being configured to have a refractive index of a mean value between a refractive index of the substrate and the second transparent conductive layer.

2. The transparent conductive film of claim 1, wherein the first optical adjustment layer, the second optical adjustment layer, and the particle are made of the same material.

3. The transparent conductive film of claim 1, wherein the particle is made of a material selected from the group consisting of silica, silicone polymer, acrylic polymer, styrene polymer, and a composition thereof.

4. The transparent conductive film of claim 1, wherein the particles are substantially spherical or ellipsoidal.

5. The transparent conductive film of claim 1, wherein flat regions of the first optical adjustment layer and the second optical adjustment layer have a thickness of about 45 nm to about 145 nm, the flat region is a region of the first optical adjustment layer or the second optical adjustment layer where no particle is provided.

6. The transparent conductive film of claim 1, wherein the substrate is a cycloolefin polymer film.

7. The transparent conductive film of claim 1, wherein distribution density of the protrusions is about 100 to about 3000 protrusions per square millimeter.

8. The transparent conductive film of claim 1, wherein the plurality of protrusions have a height of about 0.1 μm to 0.5 μm along a direction perpendicular to the surface of the first optical adjustment layer and/or the second optical adjustment layer.

9. A touch screen, comprising:
a substrate having opposed first and second surfaces, the substrate comprising a touch region in a middle portion thereof and a lead region on a periphery of the touch region;
a first optical adjustment layer formed on the first surface;
a first electrode formed on the first optical adjustment layer and within the touch region;
a first lead formed on the first optical adjustment layer and within the lead region;
a second optical adjustment layer formed on the second surface;
a second electrode formed on the second optical adjustment layer and within the touch region; and
a second lead formed on the second optical adjustment layer and within the lead region;
wherein at least one of the first optical adjustment layer and the second optical adjustment layer comprises a plurality of particles therein, such that a plurality of protrusions corresponding to the plurality of particles are formed on a surface of at least one of the first electrode and the second electrode;
wherein the first optical adjustment layer being configured to have a refractive index of a mean value between a refractive index of the substrate and the first transparent conductive layer; and
wherein the second optical adjustment layer being configured to have a refractive index of a mean value between a refractive index of the substrate and the second transparent conductive layer.

10. The touch screen of claim 9, wherein the first lead comprises a first transparent conductive layer and a first metal layer formed on the first transparent conductive layer, the first transparent conductive layer is provided with a transparent lead pattern, and the first metal layer is provided with a metal lead pattern.

11. The touch screen of claim 9, wherein the second lead comprises a second transparent conductive layer and a second metal layer formed on the second transparent conductive layer, the second transparent conductive layer is provided with a transparent lead pattern, and the second metal layer is provided with a metal lead pattern.

12. A method of manufacturing a touch screen, comprising:
providing a transparent conductive film, wherein the transparent conductive film comprises a substrate having opposed first and second surfaces; a first optical adjustment layer formed on the first surface; a first transparent conductive layer formed on the first optical adjustment layer, wherein the first optical adjustment layer being configured to have a refractive index of a mean value between a refractive index of the substrate and the first transparent conductive layer, wherein the second optical adjustment layer being configured to have a refractive index of a mean value between a refractive index of the substrate and the second transparent conductive layer; a first metal layer formed on the first transparent conductive layer; a second optical adjustment layer formed on the second surface; a second transparent conductive layer formed on the second optical adjustment layer; and a second metal layer formed on the second transparent conductive layer; wherein at least one of the first optical adjustment layer and the second optical adjustment layer comprises a plurality of particles therein, such that a plurality of protrusions corresponding to the plurality of particles are formed on a surface of at least one of the first metal layer and the second metal layer;
etching the first metal layer and the second metal layer to expose the first transparent conductive layer and the second transparent conductive layer located in a touch region, and forming a metal lead pattern located in a lead region; and
etching the first transparent conductive layer and the second transparent conductive layer to form a first electrode and a second electrode located in the touch region, and forming a transparent lead pattern located in the lead region; wherein the metal lead pattern and the transparent lead pattern cooperatively form an electrode lead.

13. The method of claim 12, wherein the first electrode is etched by the first transparent conductive layer and into a first electrode pattern, and the second electrode is etched by the second transparent conductive layer and into a second electrode pattern, and wherein each of the first and second electrode patterns are elongated and intersects vertically with each other as a grid pattern.

14. The transparent conductive film of claim 1, wherein the first metal layer has a first electrode pattern, and the second metal layer has a second electrode pattern, and wherein each of the first and second electrode patterns are elongated and intersects vertically with each other as a grid pattern.

15. The transparent conductive film of claim 8, wherein the height of the plurality of protrusions is an arithmetic mean of the height of a predetermined number of the plurality of protrusions.

16. The touch screen of claim 9, wherein the first electrode is etched by the first transparent conductive layer and into a first electrode pattern, and the second electrode is etched by the second transparent conductive layer and into a second electrode pattern, and wherein each of the first and second electrode patterns are elongated and intersects vertically with each other as a grid pattern.

* * * * *